United States Patent [19]
Goldfarb

[11] Patent Number: 5,453,703
[45] Date of Patent: Sep. 26, 1995

[54] METHOD FOR DETERMINING THE MINORITY CARRIER SURFACE RECOMBINATION LIFETIME CONSTANT ($T_S$ OF A SPECIMEN OF SEMICONDUCTOR MATERIAL

[75] Inventor: William C. Goldfarb, Melrose, Mass.

[73] Assignee: Semitest Inc., Billerica, Mass.

[21] Appl. No.: 159,334

[22] Filed: Nov. 29, 1993

[51] Int. Cl.$^6$ ..................................................... G01R 31/26
[52] U.S. Cl. ............................................ 324/765; 324/752
[58] Field of Search ........................ 324/158 R, 158 D, 324/96, 73.1, 765, 752

[56] References Cited

U.S. PATENT DOCUMENTS 4,827,212  5/1989  Kamieniecki ..................... 324/158 R

OTHER PUBLICATIONS

Oldwig von Roos, "Recombination lifetimes and surface recombination velocities of minority carriers" J. Appl. Phys., vol. 50 No. 5, May 1979.

Primary Examiner—Kenneth A. Wieder
Assistant Examiner—Mark Wardas
Attorney, Agent, or Firm—Kriegsman & Kriegsman

[57] ABSTRACT

A method is provided for determining the minority carrier surface recombination lifetime constant ($t_s$) of a specimen of semiconductor material. The specimen is positioned between a pair of electrodes, the specimen being disposed on one of the electrodes and being spaced form the other electrode. A signal is provided corresponding to the capacitance between the specimen and the electrode spaced from the specimen. A region of the surface of the specimen is illuminated with a beam of light of predetermined wavelengths and which is intensity modulated at a predetermined frequency and varying in intensity over a predetermined range. A fixed bias voltage $V_g$ applied between the pair of electrodes, the fixed bias voltage being of a value such that the semiconductor surface is in a state of depletion or inversion,. A signal is provided representing the ac photocurrent induced at the region of the specimen illuminated by the light beam. The intensity of the light beam and frequency of modulation of the light beam are selected such that the ac photocurrent is nearly proportional to the intensity of the light beam and reciprocally proportional to the frequency of modulation of the light beam. A signal is provided corresponding to the illumination intensity of the beam of light. The surface minority carrier recombination time constant ($t_s$) is then determined using the ac photocurrent capacitance and illumination intensity information.

9 Claims, 2 Drawing Sheets

5,453,703

METHOD FOR DETERMINING THE MINORITY CARRIER SURFACE RECOMBINATION LIFETIME CONSTANT ($T_s$ OF A SPECIMEN OF SEMICONDUCTOR MATERIAL

BACKGROUND OF THE INVENTION

The present invention relates to a method for determining the minority carrier surface recombination lifetime constant ($t_s$) of a specimen of semiconductor material.

Metals such as ion and copper are common problems in manufacturing silicon devices. Small quantities of these element which find their way into product wafers during processing cause lowered voltage breakdown values and reduced device yield. The value of the minority carrier surface recombination lifetime constant ($t_s$) is well known to be sensitive to semiconductor metallic contamination. The ($t_s$) value is also known to be sensitive to damage of crystalline order of the silicon-silicon oxide interface boundary.

A number of methods are known for measuring ($t_s$). These include photoconductivity decay (PCD), CV pulse, surface photovoltage (SPV) using various wavelengths of light, short-circuit current open-circuit voltage decay, photoluminescence decay and election beam induce current decay.

In U.S. Pat. No. 4,827,212 to E. Kamieniecki, which patent is incorporated herein by reference, there is described a method and apparatus for characterizing a semiconductor using the surface photovoltage (SPV) effect. A region of the surface of a semiconductor is illuminated with an intensity modulated beam of light, the wavelength of the light being shorter than that corresponding to the energy gap of the semiconductor. The surface photovoltage (SPV) induced in the semiconductor is measured under varying bias voltage conditions. The intensity of the light beam and the frequency of modulation are selected such that the surface photovoltage (SPV) is directly proportional to the intensity and reciprocally proportional to the frequency of modulation. The apparatus includes a pair of electrodes, a light source, a modulated power supply, a dc bias voltage source, an amplifier, a phase sensitive detector, an A/D converter and a computer. Using the surface photovoltage (SPV) and the bias voltage ($V_g$) measurements, the charge induced in the semiconductor space charge region ($Q_{sc}$) and the charge induced in the semiconductor ($Q_{ind}$) are determined. This information is used to determine certain specified parameters of the semiconductor such as surface state density and oxide/insulator charge doping type and doping concentration. The technique is designed especially for use in characterizing semiconductor wafers, coated or uncoated, but may, if desired, also be used in characterizing MIS or MOS type semiconductor devices.

In U.S. Pat. No. 4,891,584 to E. Kamieniecki et al there is described an apparatus for making ac surface photovoltage (SPV) measurements of a specimen of semiconductor material under dc bias voltage conditions which includes a light source whose output beam is intensity modulated, an adjustable dc bias voltage source, a conductive base for supporting the specimen and a novel capacitance type reference electrode assembly for sensing the SPV signals. The reference electrode assembly includes in one embodiment a transparent flexible sheet of insulating material having on one surface a first conductive coating which serves as a reference electrode and a second conductive coating which serves as a guard electrode, the first coating being transparent. The flexible sheet of insulating material is attached to a flat glass plate through an annular spacer. An elastomeric button is positioned between the sheet and the glass plate. When the SPV measurements are being taken the flexible sheet is pressed against the specimen with pressure sufficient to hold the reference electrode in close compliance with the specimen, with the pressure being applied to the glass plate and being transmitted from the glass plate to the flexible sheet of insulating material through the elastomeric button.

In U.S. Pat. No. 4,333,051 to A. Goodman there is disclosed a method and apparatus for determining the diffusion length of minority carriers in semiconductors using the constant-magnitude surface-photovoltage (SPV) method. A servo system maintains a constant predetermined value of the SPV. A novel capacitance-pickup electrode couples the SPV to a preamplifier in the measurement system and functions to reduce SPV drift. A keyboard or computer is used to select both the operating optical wavelength of an adjustable monochromator and a network to compensate for the wavelength dependent sensitivity of a photodetector used to measure the illumination intensity (photon flux) on the semiconductor. Measurements of the relative photon flux for a plurality of wavelengths are plotted against the reciprocal of the optical absorption coefficient of the material. A linear plot of the data points is extrapolated to zero intensity. The negative intercept value on the reciprocal optical absorption coefficient axis of the extrapolated linear plot is the diffusion length of the minority carriers.

In U.S. Pat. No. 4,649,339 to R. Gangrath there is disclosed an interface for testing an integrated circuit device through a plurality of contacts on an exposed surface of the device. The interface comprises a flexible sheeting having first and second opposing surfaces. A plurality of contacts are disposed on the first surface of the sheet in a pattern designed to mate with a plurality of contacts on an integrated circuit device. A plurality of thin film conductors are patterned on the sheet, the conductors each being connected to a contact on the sheet and being adapted for connection to a circuit for testing the device. The interface comprises apparatus for preforming into a generally domed shape a portion of the sheet which includes a plurality of the contacts and apparatus for flexing the flexible sheet so that the contacts on both the sheet and the device may be brought into intimate contact.

In U.S. Pat. No. 5,091,691 to E. Kamieniecki et al there is disclosed an apparatus for making ac surface photovoltage (SPV) measurements of a specimen of semiconductor material under dc bias voltage conditions. This apparatus includes a light source whose output beam is intensity modulated, an adjustable dc bias voltage source, a conductive base for supporting the specimen and a novel capacitance type reference electrode assembly for sensing the SPV signals. The reference electrode assembly includes in one embodiment a bottom made of insulating elastomeric material and attached to a rigid plate made of insulating material. A film made of insulating material and having a conductive coating on one side which serves as a reference electrode is attached to the button. When SPV measurements are being taken, the film is pressed against the specimen with pressure sufficient to hold the reference electrode in close compliance with the specimen, with pressure being applied to the plate from an external source and being transmitted from the rigid plate to the film through the elastomeric button.

In U.S. Pat. No. 4,393,348 to B. Goldstein et al there is disclosed a method and apparatus for determining the diffusion length of minority carriers in semiconductor material, particularly amorphous silicon which has a significantly small minority carrier diffusion length, using the constant-magnitude surface-photovoltage (SPV) method. An unmodulated illumination provides the light excitation on the surface of the material to generate the SPV. A vibrating Kelvin method-type probe electrode couples the SPV to a measurement system. The operating optical wavelength of an adjustable monochromator to compensate for the wavelength dependent sensitivity of a photodetector is selected to measure the illumination intensity (photon flux) on the silicon. Measurements of the relative photon flux for a plurality of wavelengths are plotted against the reciprocal of the optical absorption coefficient of the material. A linear plot of the data points is extrapolated to zero intensity. The negative intercept value on the reciprocal optical coefficient axis of the extrapolated linear plot is the diffusion length of the minority carriers.

In U.S. Pat. No. 5,087,876 to L. Reiss et al, which patent is incorporated herein by reference, there is disclosed an apparatus for making ac surface photovoltage (SPV) measurements of a specimen of semiconductor material under variable dc bias voltage conditions. The apparatus includes a light source whose output beam is intensity modulated, a reference electrode, a guard electrode, a back electrode, a first voltage for biasing the reference electrode with a variable dc voltage and a second voltage separate from the first voltage for biasing the guard electrode such that an accumulation layer is established in the area on the specimen controlled by the guard electrode to prevent flow of carriers between the area controlled by the reference electrode and the rest of the specimen.

It is an object of this invention to provide a new and improved method for determining the minority carrier surface recombination lifetime constant ($t_s$) of a specimen of semiconductor material.

It is another object of this invention to provide a method as described above which is fast and reliable.

It is still another object of this invention to provide a method as described above which can be practiced using apparatus similar to that described in the above noted Kamieniecki and Reiss patents.

SUMMARY OF THE INVENTION

According to one embodiment of this invention, a method is provided for determining the minority carrier surface recombination lifetime constant ($t_s$) of a specimen of semiconductor material, the specimen having a surface arranged for illumination, the method comprising providing a pair of electrodes, positioning the specimen between the pair of electrodes, said specimen being disposed on one of said electrodes and spaced from said other electrode, providing a signal corresponding to the capacitance between the specimen and the electrode spaced from the specimen, illuminating a region of the surface of the specimen arranged for illumination with a beam of light of wavelengths shorter than that of the energy gap of the semiconductor, the beam of light being intensity modulated at a predetermined frequency and varying in intensity over a predetermined range, applying a fixed bias voltage ($V_g$) between the pair of electrodes, the fixed bias voltage being of value such that the semiconductor surface is in a state of depletion or inversion, providing a signal representing the ac photocurrent at the region of the specimen illuminated by the light beam, the intensity of the light beam and frequency of modulation of the light beam being such that the ac photocurrent is nearly proportional to the intensity of the light beam and reciprocally proportional to the frequency of modulation of the light beam, providing a signal corresponding to the illumination intensity of the beam of light, and then, determining the surface minority carrier recombination time constant ($t_s$) using said ac photocurrent, capacitance and illumination intensity information.

The ac photocurrent is "nearly" proportional to the intensity of the light beam in that the second order term is significant while the third and higher order terms are not significant.

Instead of providing a signal representing the ac photocurrent, a signal may be provided corresponding to the ac photovoltage.

According to another embodiment of the invention, a method is provided for determining the minority carrier surface recombination lifetime constant ($t_s$) of a specimen of semiconductor material, the specimen having a surface arranged for illumination, the method comprising providing a pair of electrodes, positioning the specimen between the pair of electrodes, said specimen being disposed on one of said electrodes and spaced from said other electrodes, providing a signal corresponding to the capacitance between the two electrodes, illuminating a region of the surface of the specimen arranged for illumination with a beam of light of wavelengths shorter than that of the energy gap of the semiconductor, the beam of light varying in intensity over a predetermined range, applying a fixed bias voltage ($V_g$) between the pair of electrodes, the fixed bias voltage being of a value such that the semiconductor surface is in a state of depletion or inversion, the intensity range of the light beam being such that the capacitance between the two electrodes is measurably changed as the light intensity changes, providing information corresponding to the doping concentration, providing a signal corresponding to the illumination intensity of the beam of light, and then determining the surface minority carrier recombination time constant ($t_s$) using said signal information so provided.

Various features and advantages will appear from the description to follow. In the description, reference is made to the accompanying drawings which forms a part thereof, and in which is shown by way of illustration, a specific embodiment of an apparatus for practicing the invention. This embodiment will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings wherein like reference numerals represent like parts.

DETAILED DESCRIPTION OF PREFERRED EMBODIMENTS

Figure 1:
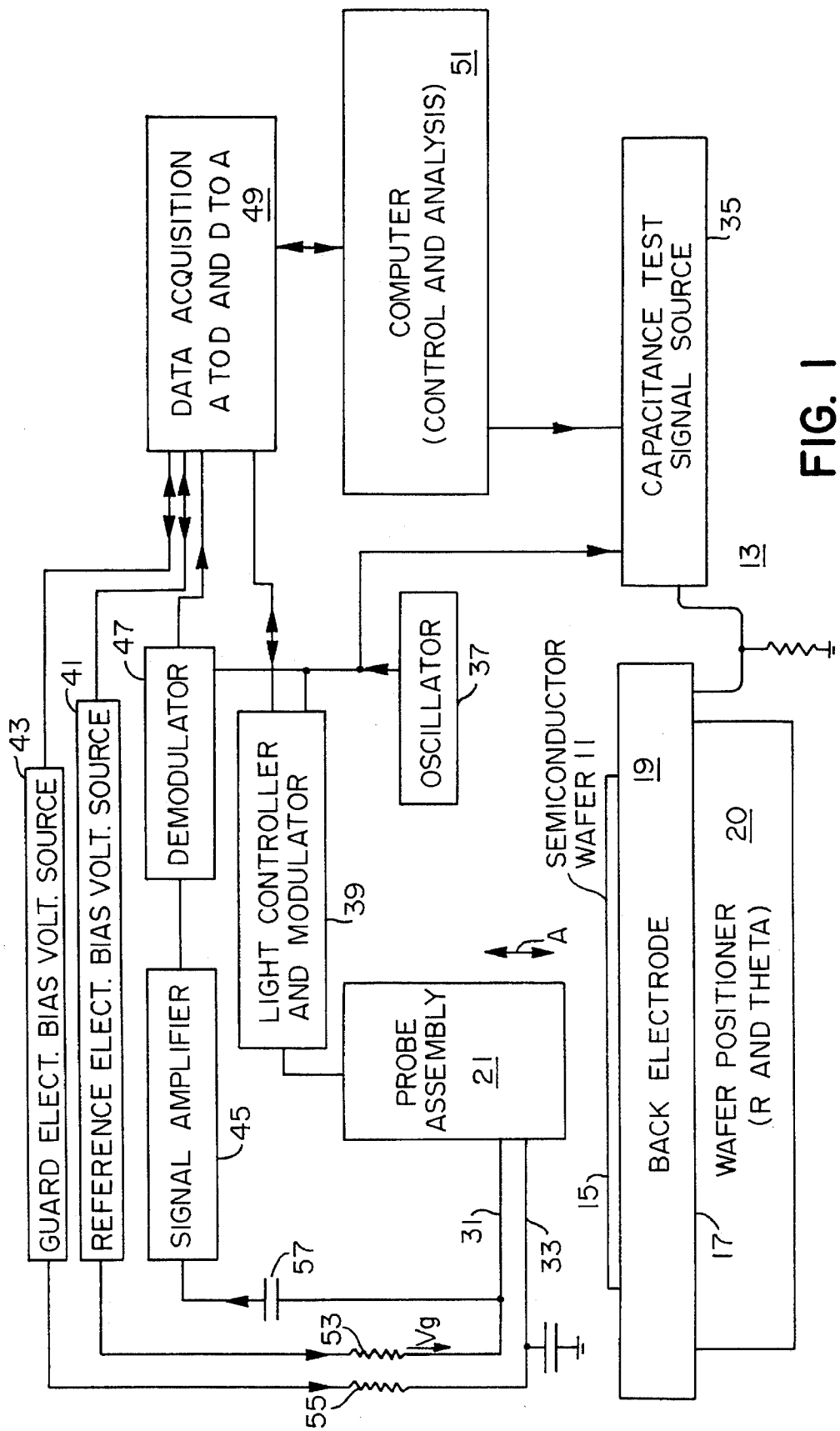
FIG. 1 is a schematic block diagram of an apparatus for practicing the invention.

The present invention is directed to a method for determining the minority carrier surface recombination lifetime constant ($t_s$) of a specimen of semiconductor material using a variable intensity beam of light.

Before explaining the details of the method of this invention, the underlying theory will now be explained.

The electrostatic potential $\Psi$ in the bulk of a semiconductor may be defined as zero. It varies near the surface when there is a layer devoid of majority carriers, the space charge region. At the semiconductor surface $\Psi=\Psi_s$; $\Psi_s$ is called the surface potential. The space charge region is a layer of thickness $W_d$. It is a charged insulating layer with charge density p=q*N. Integrating a one dimensional Poisson's equation gives the relationship between the doping concentration N, the surface potential and the surface potential.

$$W_d := \left( \frac{2 \cdot \epsilon_s \cdot \Psi_s}{q \cdot N_{sc}} \right)^{1/2}. \tag{a1}$$

Equation (a1) can be used along with the requirement for charge balance to produce the relationship between the surface potential and the rates of minority carrier generation and recombination.

Charge neutrality requires that any change in surface charge density DQss is compensated with an equivalent change in the space charge region: dQss=dQsc.

The rates of change of the total surface density of free minority carriers, G and surface states with majority charge, R balances with the change in the space charge region. This allows one to write the expression for the rate of change of the surface potential as $$\frac{1}{q} \cdot \frac{d}{dt} Q_{sc} := G - R \tag{a2}$$

$$\frac{1}{q} \cdot \frac{d}{dt} (q \cdot N_{sc} \cdot W_d) := G - R \tag{a3}$$

$$\sqrt{\frac{\epsilon_s \cdot N}{2 \cdot q}} \cdot \frac{1}{\sqrt{\Psi_s}} \cdot \frac{d}{dt} \Psi_s := G - R \tag{a4}$$

In the small disturbance approximation where v*kT/q<<1.

$$G = \Phi \cdot (1 - \text{ref}) \cdot \left( 1 - \frac{\exp(-\alpha \cdot W_d)}{1 + \alpha \cdot L_p} \right) \tag{a5}$$

$$R = v \cdot \left( \frac{q}{kT} \right) \cdot v \cdot N_{sc} \cdot \exp\left( \frac{q \cdot \Psi_0}{kT} \right) \tag{a6}$$

Where:
$\Psi$=incident photon flux
r=reflection coefficient of the semiconductor
$\alpha$=the absorption coefficient
$L_p$=minority carrier diffusion length
v=surface capture velocity
$\Psi_s = \Psi_0 + v$, surface potential=static (dark) part $\Psi_0$, plus a variable part v.

For larger absorption coefficients ($\alpha*Wd>1$)G is essentially independent of WD and $\Psi$s and can be replaced by $\Phi$ since the remaining factors will act as a scaling factor which will drop out in the final analysis.

By applying this simplification and equation a1 and a6 to the differential equation for the surface potential a4 linearized form.

$$\frac{\epsilon_s}{q \cdot W_d} \cdot \frac{d}{dt} v := \Phi - v \cdot \frac{q}{kT} \cdot N_{sc} \cdot \exp\left( \frac{q \cdot \Psi_0}{kT} \right) \cdot v \tag{a7}$$

is produced. By introducing the definition $$\frac{1}{t_s} := \frac{q \cdot W_d}{\epsilon_s} \cdot \left( v \cdot \frac{q}{kT} \cdot N_{sc} \cdot \exp\left( \frac{q \cdot \Psi_0}{kT} \right) \right) \tag{a8}$$

results in a first order differential equation in simple form $$\frac{d}{dt} v := \Phi \cdot \frac{q}{\epsilon_s} \cdot W_d - \frac{v}{t_s} \tag{a9}$$

The solution for a step function change in light $\Phi$ is $$v := t_s \cdot \Phi \cdot \frac{q}{\epsilon_s} \cdot W_d \left( 1 - \exp\left( -\frac{t}{t_s} \right) \right). \tag{a10}$$

which settles after a few $t_s$ has past to $$v_{dc} = t_s \cdot \Phi \cdot \frac{q}{\epsilon_s} \cdot W_d \tag{a11}$$

If the generating light is sine modulated with frequency $\omega$ the differential equation has a solution $$v_{ac} = \frac{q}{\epsilon_s} \cdot \Phi \cdot W_d \cdot \frac{\tau_s}{(1 + j \cdot \omega \cdot t_s)} \tag{a12}$$

The AC modulated light use to stimulate the photovoltage signal has a DC component which modifies the steady state value of the surface potential. For small values of disturbance such that $$\frac{v}{\Psi_0} \ll 1$$

the effects of the steady state modification of $\Psi_s$ can be accounted for in the AC solution by expending equation a1 to first order and substituting the value of the DC surface potential deviation, v.

$$W_d = \left( 2 \cdot \frac{\epsilon_s}{q} \cdot \frac{\Psi_0}{N_{sc}} \right)^{1/2} \cdot \left( 1 + \frac{v}{2 \cdot \Psi_0} \right) \tag{a13}$$

$$W_d = W_{d0} \cdot \left( 1 + \frac{v}{2 \cdot \Psi_0} \right)$$

$$v_{ac} = \frac{q}{\epsilon_s} \cdot \Phi \cdot W_{d0} \cdot \left( 1 + \frac{v}{2 \cdot \Psi_0} \right) \frac{t_s}{(1 + j \cdot \omega \cdot t_s)} \tag{a14}$$

At frequencies for which $\Phi*t_s \gg 1$, $v \approx v_{dc}$ a14 reduces to $$|v_{ac}| = \frac{|q|}{\epsilon_s} \cdot \Phi \cdot W_{d0} \cdot \left( 1 + \frac{t_s \cdot \Phi \cdot \frac{q}{\epsilon_s} \cdot W_{d0}}{2 \cdot \Psi_0} \right) \frac{1}{\omega} \tag{a15}$$

If instead of photo voltage the photo current is read through a pickup capacitance of Cp then $$\frac{|i\_ac|}{Cp \cdot \Phi} = \frac{|q|}{\epsilon_s} \cdot W_{d0} + \frac{t_s \cdot \left(\frac{q}{\epsilon_s} \cdot W_{d0}\right)^2}{2 \cdot \Psi_0} \cdot \Phi \quad \text{(a16)}$$

Photocurrent is more desirable to measure than photovoltage since there is a better signal-to-noise ratio when measuring photocurrent.

Alternatively, the AC capacitance rather than the ac photovoltage may be monitored. The expressions for surface potential and depletion width also result in a simple expression relating Cp and light intensity.

$$\frac{1}{Cp} = \frac{W_d}{a \cdot \epsilon_s} = \frac{W_{d0}}{a \cdot \epsilon_s} \cdot \left(1 + \frac{v}{2 \cdot \Psi_0}\right) \approx$$

$$\frac{W_{d0}}{a \cdot \epsilon_s} \cdot \left(1 + \frac{t_s \cdot \Phi \cdot \frac{q}{\epsilon_s} \cdot W_{d0}}{2 \cdot \Psi_0}\right)$$

and $$\frac{d}{d\Phi}\left(\frac{1}{C_p}\right) = \frac{t_s}{a} \cdot \frac{q}{\epsilon_s^2} \cdot \frac{W_{d0}^2}{2 \cdot \Psi_0}$$

Referring now to the drawings, there is shown in FIG. 1 a simplified block diagram of an apparatus for determining the minority carrier surface recombination lifetime ($t_s$) of a specimen of semiconductor material according to this invention. Portions of the apparatus not pertinent to this invention are not shown. In the illustration, the specimen of semiconductor material is identified by reference numeral 11 and the apparatus is identified by reference numeral 13.

Specimen 11 has two major surfaces 15 and 17, respectively, surface 15 being the surface under testing. Specimen 11 comprises a slab of silicon in a wafer configuration. An oxide coating (not shown) may be on surface 15 of specimen 11.

Apparatus 13 includes a back electrode 19 and a capacitive pickup type probe assembly 21. Back electrode 19 is constructed in the form of a wafer chuck and, as such, in addition to functioning as an electrode serves to support and hold specimen 11 fixed during testing. Back electrode 19 made of a conductive metal, such as aluminum. Specimen 11 is mounted on back electrode 19 with surface 15 facing upward and surface 17 in contact with or closely spaced from back electrode 19 facing downward. Back electrode 19 is fixedly mounted on a wafer positioner 20 which is movable in R and theta directions so that different parts of the surface of specimen 11 on back electrode can be positioned under probe assembly 21 for testing. Probe assembly 21 is movable vertically up and down relative to back electrode 19, as shown by arrows A, by any suitable means, (not shown) so that it can be lowered into contact with specimen 11 for testing and then raised after the measurements have been taken, Alternatively, (not shown) probe assembly 21 could be stationary and wafer positioner 20 movable vertically as well as in R and theta relative to reference electrode assembly 21.

Figure 2:
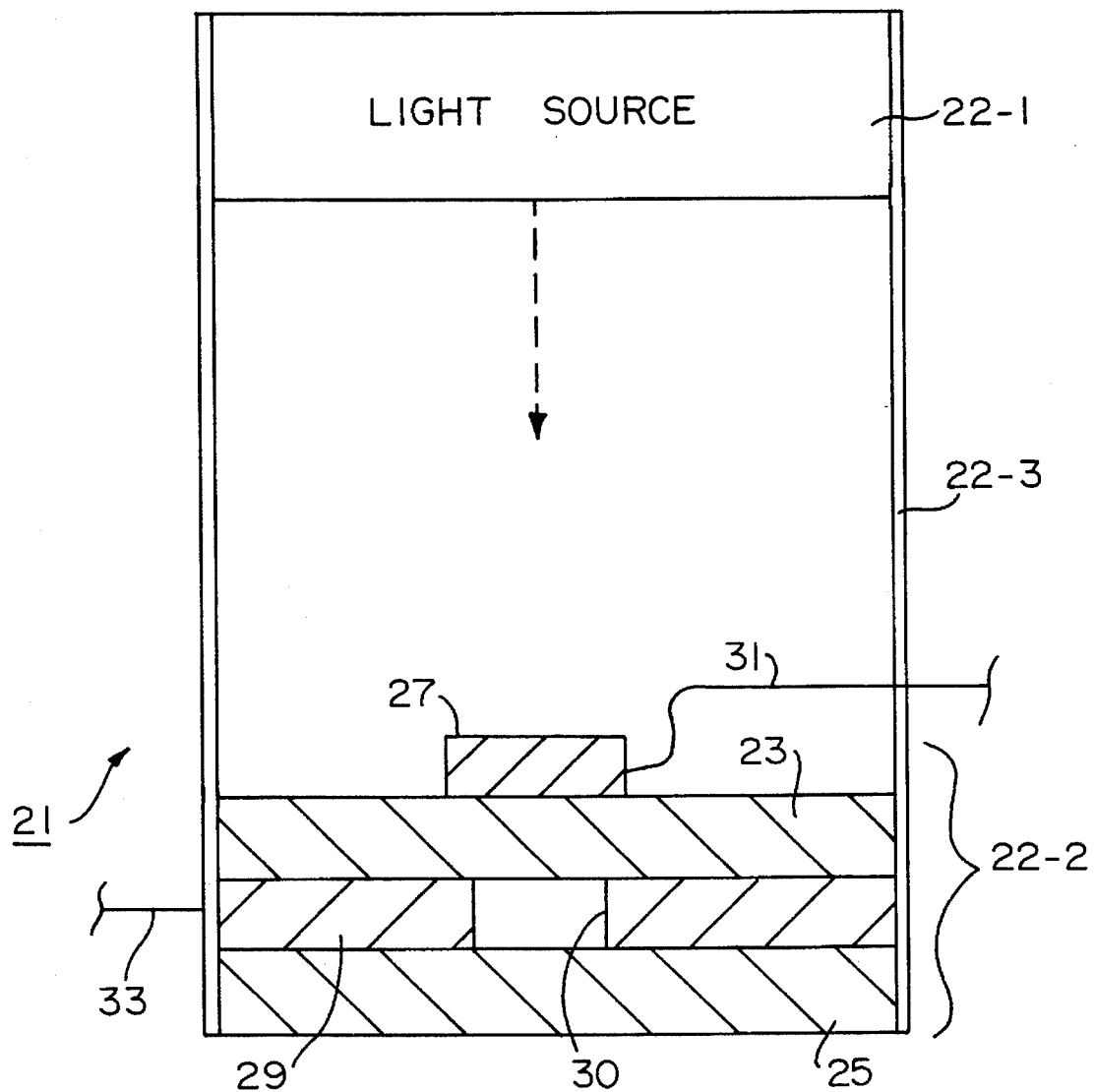
FIG. 2 is a more detailed view of the probe assembly shown in FIG. 1.

Probe assembly 21 which is also shown enlarged and in more detail in FIG. 2 includes a light source 22-1 and a probe 22-2. Light source 22-1 may be, for example, an LED. Probe 22-2 includes upper and lower sheets of mylar labelled 23 and 25 respectively. A pair of coatings 27 and 29 of conductive material are formed on the top surfaces of the sheets 23 and 25 respectively by any suitable means, such as deposition. Coating 27 is circular in shape and serves as a reference electrode. Coating 29 is annularly shaped and serves as a guard electrode. Both coatings 27 and 29 may be made of aluminum. The thickness of coating 27 and its composition are such that it is transparent. Reference electrode 27 is smaller than specimen 11. Coating 29 is preferably, nontransparent; however it is not essential that it be nontransparent. As can be seen, sheet 25 electrically separates coatings 27 and 29 from specimen 11 and sheet 23 electrically separates coating 27 from coating 29. The center opening 30 in coating 29 is smaller than the area of coating 27. A conductor 31 is connected to electrode 27 and a conductor 33 is connected to electrode 29. Instead of having coating 29 on the top surface of sheet 25, coating 29 could, if desired, be formed on the bottom surface of sheet 23. Light source 22-1 and probe 22-2 are fixedly mounted in a frame 22-3.

Apparatus 13 further includes a capacitance test signal source 35, an oscillator 37, a light controller and modulator 39, a reference electrode bias voltage source 41, a guard electrode bias voltage source 43, a signal amplifier 45, a demodulator 47, a data acquisition system 49 and a computer 51.

Capacitance test signal source 35 provides a small (i.e. few millivolt) ac potential on back electrode 19 so that the capacitance between wafer 11 and probe assembly 22-2 can be measured. Oscillator 37 provides signals to drive light source 22-1 and capacitance test signal source 35. Also, oscillator 37 provides a synchronizing signal to light controller and modulator 39. Light controller and modulator 39 ac modulates and varies the amplitude of the signal provided from oscillator 37 to light source 22-1 so as to produce an ac modulated light beam of varying intensity.

Reference electrode bias voltage source 41 produces a variable dc voltage. Guard electrode bias voltage source 43 produces a voltage sufficient to place an area of the surface of specimen 11 surrounding an area controlled by reference electrode 27 in accumulation condition at least during the time when the area of specimen 11 controlled reference electrode 27 is in an inversion condition. Guard electrode bias voltage source 43 may be either a voltage source which produces a fixed dc voltage or a variable dc voltage. If voltage source 43 is one that produces a variable dc voltage, the voltage must be such that the area on semiconductor 11 controlled by guard 29 electrode is in accumulation at least during the time when the area on semiconductor 11 controlled by reference electrode 27 is between the onset of accumulation and the onset of strong inversion. If DC bias voltage source 43 is fixed it is sized so as to continually create an accumulation layer.

Signal amplifier 45 amplifies the signal received from reference electrode 27. Demodulator 47, which is a synchronous demodulator, changes the ac signals received from signal amplifier 45 to dc signals. Data acquisition system 49 converts analog signals received from voltage sources 41 and 43, demodulator 47 and light controller and modulator 39 into digital signals and converts digital signals from computer 51 into analog signals. Computer 51 controls the overall operations of system 13 and processes test information received.

In using apparatus 13, specimen 11 is placed on back electrode 19 as shown. Probe assembly 21 is then moved vertically down so that reference electrode 27 is in close proximity to specimen 11. Probe assembly 21 is then pressed down against specimen 11 by any means (not shown) with sufficient pressure so that reference electrode 27 is in close compliance (i.e. parallel relationship) with surface 15 of specimen 11. Since reference electrode 27 is formed on the top surface of insulator 35, it does not actually come into contact with specimen but rather forms a capacitance type of pickup. A beam of light from light source 22-1 which may be ac modulated and intensity varied by light controller and modulator 39 as instructed by computer 51 is then directed through flexible reference electrode assembly 21 onto front surface 15 of specimen 11 to generate ac surface photocurrent signals or ac surface photovoltage signals, the particular signals being a matter of choice. AC photocurrent signals are preferred since they have a higher signal-to-noise ration. As can be appreciated, the light beam from source light source 22-1 will pass through reference electrode 27 since it is transparent. At the same time, the bias voltages from sources 41 and 43 amplitude modulated as instructed by computer 51 are applied to their respective electrodes 27 and 29 through separation resistors 53 and 55, respectively.

The dc photocurrent (or photovoltage) signals developed across the surface 15 of specimen 11 upon illumination and the ac potential signals resulting from source 11 are capacitively picked up sequentially by reference electrode 27 and fed through an isolation capacitor 57 into signal amplifier 45. Signals picked up by guard electrode 29 are shunted to ground. As can be appreciated, guard electrode 29 also serves to avoid fringing field problems in the application of the bias field by the reference electrode and also serves to limit the area on surface 15 of specimen 11 that provides the surface photocurrent signal to reference electrode 27. The output of signal amplifier 45 is fed into demodulator 47. The output of demodulator 47 is fed into data acquisition system 49 whose output is fed into computer 51.

A method of determining ($t_s$) according to this invention and using apparatus 13 will now be described.

The first step in the method involves determining the value of the induced charge Qind required to put wafer surface 15 into the inversion condition. This may be achieved by illuminating surface 15 with ac modulated, light of fixed intensity from source 22-1, stepping the bias voltage from bias voltage source 41 over a range, and then measuring the probe to wafer capacitance and ac photocurrent signal using probe 22-2.

The relation between the width of the silicon depletion region, $W_d$, and the ac photo current i ac signal picked up by the probe 22-2 is given by the formula.

$$|i\_ac| = C_p * (|q|/\epsilon_s) * \Phi * (1-\text{refl}) * W_d.$$

where:

| | |
|---|---|
| cp | total probe to wafer capacitance. |
| q | charge on a electron. |
| $\epsilon_s$ | dielectric constant of the semiconductor. |
| $\Phi$ | illumination intensity. |
| refl | 1-refl = fraction of illumination which enters the silicon. |

With this formula, the depletion width is computed over the range of induced charge bias. The $Q_{induced}$ which was imposed on the semiconductor at each bias step is computed from $Q_{induced} = V_g * C_p$.

The $Q_{induced}$ value for inversion is determined from the shape of the $W_d$ vs $Q_{ind}$ function. The value of $Q_{ind}$ at which the $W_d$ ($Q_{ind}$) flattens out establishes $Q_{ind}$ for inversion.

The second step in the method involves applying the correct fixed biasing voltage value from source 41 to probe 22-1 as determined by the above noted first set to put the semiconductor surface into a reproducible state of inversion. The surface minority carrier time constant value will depend on how deeply into inversion the material is placed.

The third step in the method involves collecting the probe capacitance and photocurrent data over a set of modulated light levels (i.e. by varying the intensity of the ac modulated light over a set of values) and measuring the probe capacitance and photocurrent at each one of the set of values. The intensity of the light beam and frequency of modulation of the light beam are such that the ac photocurrent is nearly proportional to the intensity of the light beam and reciprocally proportional to the frequency of modulation of the light beam. The term "nearly" as used herein means that the second order term is significant while the third and higher order terms are not significant.

Using stored conversion constants, the data is converted to the following physical measurements.

(1) Total probe to wafer capacitance;
(2) AC photocurrent: i_ac [amp];
(3) Light Intensity entering wafer surface: $\Phi$ in units [#photons/cm^2*sec)].

The final step in the method involves computing the minority carrier recombination time constant ($t_s$) from the above measurements.

A first degree expansion of the surface photovoltage equation leads to the following expected relationship between the acquired data and the physical parameters of the wafer under test:

$$\frac{|i\_ac|}{C_p \cdot \Phi} = \frac{|q|}{\epsilon_s} \cdot W_{d0} + \frac{t_s \left(\frac{q}{\epsilon_s} \cdot W_{d0}\right)^2}{2 \cdot \Psi_0} \cdot \Phi$$

where:

q: Electron charge
$\epsilon_s$: Dielectric constant of the semiconductor
Wd0: Inversion state surface depletion width (undisturbed, that is, dark conditions).
$\Psi_0$: Semiconductor surface potential in inversion and dark conditions Numerical curve fitting (regression) of the $$\frac{|i\_ac|}{C_p \cdot \Phi} \text{ vs } \phi$$

data set gives a measured estimate of $$\frac{|q|}{\epsilon_s} \cdot W_{d0} \text{ and } \frac{t_s \cdot \left(\frac{q}{\epsilon_s} \cdot W_{d0}\right)^2}{2 \cdot \Psi_0}$$

Since Wd0 and $\Psi_0$ are algebraically related one to another and to the wafer doping concentration the regression result allows one to solve for the surface minority carrier recombination time, $t_s$.

Another embodiment of the method involves only the measurement of the total capacitance between the probe and wafer. This embodiment, unlike the first embodiment requires a separate measurement of the wafer doping concentration or equivalently of values for inversion depletion width and/or surface potential.

This method uses the DC response of the photopotential to low levels of light. Consequently the test light does not need to have a high frequency modulation component as it must in the first embodiment described above.

According to this method, the 1/Cp data vs light intensity data is fit by a straight line using the method of linear regression. The slope derived from the regression when combined with known values for Wd0, Y0, the measurement area a, and constants allows the calculation of $t_s$ using:

$$\text{slope} \frac{d}{d\Phi}\left(\frac{1}{C_p}\right) = \frac{t_s}{a} \cdot \frac{q}{\epsilon_s^2} \cdot \frac{W_{d0}^2}{2 \cdot \Psi_0}$$

By using ($t_s$) as derived by either method described above and the doping concentration, the surface recombination velocity (or surface capture velocity) can be obtained.

The embodiments of the present invention are intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. A method of determining the minority carrier surface recombination lifetime constant ($t_s$) of a specimen of semiconductor material, the specimen having a surface arranged for illumination, the method comprising:
   a. providing a pair of electrodes,
   b. positioning the specimen between the pair of electrodes, said specimen being disposed on one of said electrodes and spaced from said other electrode,
   c. providing a signal representing to the capacitance between the specimen and the electrode spaced from the specimen,
   d. illuminating a region of the surface of the specimen arranged for illumination with a beam of light of wavelengths shorter than that of the energy gap of the semiconductor, the beam of light being intensity modulated at a predetermined frequency and varying in intensity over a predetermined range of values,
   e. applying a fixed bias voltage ($V_g$) between the pair of electrodes, the fixed bias voltage being of a value such that the semiconductor surface is in a state of depletion or inversion,
   f. providing a signal representing the ac photocurrent at the region of the specimen illuminated by the light beam,
   g. the intensity of the light beam and frequency of modulation of the light beam being such that the ac photocurrent is nearly proportional to the intensity of the light beam and reciprocally proportional to the frequency of modulation of the light beam,
   h. providing a signal corresponding to the illumination intensity of the beam of light, and then,
   i. determining the surface minority carrier recombination time constant ($t_s$) using said ac photocurrent, capacitance and illumination intensity information.

2. The method of claim 1 wherein providing a signal corresponding to the capacitance between the specimen and the electrode spaced form the specimen comprises applying an ac potential to the electrode on which the specimen is positioned and then measuring the capacitive signal on the other electrode.

3. A method of determining the minority carrier surface recombination lifetime constant ($t_s$) of a specimen of semiconductor material, the specimen having a surface arranged for illumination, the method comprising:
   a. providing a pair of electrodes,
   b. positioning the specimen between the pair of electrodes, said specimen being disposed on one of said electrodes and spaced from said other electrodes,
   c. providing a signal representing to the capacitance between the two electrodes,
   d. illuminating a region of the surface of the specimen arranged for illumination with a beam of light of wavelengths shorter than that of the energy gap of the semiconductor, the beam of light varying in intensity over a predetermined range,
   e. applying a fixed bias voltage ($V_g$) between the pair of electrodes, the fixed bias voltage being of a value such that the semiconductor surface is in a state of depletion or inversion,
   f. the intensity range of the light beam being such that the capacitance between the two electrodes is measurably changed as the light intensity changes,
   g. providing information corresponding to the doping concentration,
   h. providing a signal corresponding to the illumination intensity of the beam of light, and then
   i. determining the surface minority carrier recombination time constant ($t_s$) using said signal information so provided.

4. A method of determining the minority carrier surface recombination lifetime constant ($t_s$) of a specimen of semiconductor material, the specimen having a surface arranged for illumination, the method comprising:
   a. providing a pair of electrodes,
   b. positioning the specimen between the pair of electrodes, said specimen being disposed on one of said electrodes and spaced from said other electrode,
   c. providing a signal representing to the capacitance between the specimen and the electrode spaced from the specimen,
   d. illuminating a region of the surface of the specimen arranged for illumination with a beam of light of wavelengths shorter than that of the energy gap of the semiconductor, the beam of light being intensity modulated at a predetermined frequency and varying in intensity over a predetermined range of values,
   e. applying a fixed bias voltage ($V_g$) between the pair of electrodes, the fixed bias voltage being of a value such that the semiconductor surface is in a state of depletion or inversion,
   f. providing a signal representing the ac photovoltage at the region of the specimen illuminated by the light beam,
   g. the intensity of the light beam and frequency of modulation of the light beam being such that the ac photovoltage is nearly proportional to the intensity of the light beam and reciprocally proportional to the frequency of modulation of the light beam,
   h. providing a signal corresponding to the illumination intensity of the beam of light, and then,
   i. determining the surface minority carrier recombination time constant ($t_s$) using said ac photocurrent, capacitance and illumination intensity information.

5. A method of determining the minority carrier surface recombination lifetime constant ($t_s$) of a specimen of semiconductor material, the specimen having a surface arranged for illumination, the method comprising:
   a. providing a pair of electrodes, b. positioning the specimen between the pair of electrodes, said specimen being disposed on one of said electrodes and spaced from said other electrode, c. providing a signal corresponding to the capacitance between the specimen and the electrode spaced from the specimen, d. illuminating a region of the surface of the specimen arranged for illumination with a beam of light of wavelengths shorter than that of the energy gap of the semiconductor, the beam of light being intensity modulated at a predetermined frequency and varying in intensity over a predetermined range of bolos, e. applying a fixed bias voltage ($V_g$) between the pair of electrodes, the fixed bias voltage being of a value such that the semiconductor surface is in a state of depletion or inversion and being determined using the equation:

$$Q_{induced} = V_g * C_p$$

f. providing a signal representing the ac photocurrent at the region of the specimen illuminated by the light beam, g. the intensity of the light beam and frequency of modulation of the light beam being such that the ac photocurrent is nearly proportional to the intensity of the light beam and reciprocally proportional to the frequency of modulation of the light beam, h. providing a signal corresponding to the illumination intensity of the beam of light, and then, i. determining the surface minority carrier recombination time constant ($t_s$) using said ac photocurrent, capacitance and illumination intensity information.

6. The method of claim 5 wherein determining the value of the surface minority carrier recombination time ($t_s$) includes illuminating the specimen with ac modulated light of fixed intensity stepping the bias voltage over a range and measuring the capacitance between the specimen and the electrode spaced from the specimen and the ac photovoltage signal at each bias value.

7. A method of determining the minority carrier surface recombination lifetime constant ($t_s$) of a specimen of semiconductor material, the specimen having a surface arranged for illumination, the method comprising:

a. providing a pair of electrodes, b. positioning the specimen between the pair of electrodes, said specimen being disposed on one of said electrodes and spaced from said other electrode, c. providing a signal corresponding to the capacitance between the specimen and the electrode spaced from the specimen, d. illuminating a region of the surface of the specimen arranged for illumination with a beam of light of wavelengths shorter than that of the energy gap of the semiconductor, the beam of light being intensity modulated at a predetermined frequency and varying in intensity over a predetermined range of values, e. applying a fixed bias voltage ($V_g$) between the pair of electrodes, the fixed bias voltage being of a value such that the semiconductor surface is in a state of depletion or inversion, f. providing a signal representing the ac photocurrent at the region of the specimen illuminated by the light beam, g. the intensity of the light beam and frequency of modulation of the light beam being such that the ac photocurrent is nearly proportional to the intensity of the light beam and reciprocally proportional to the frequency of modulation of the light beam, h. providing a signal corresponding to the illumination intensity of the beam of light, and then, i. determining the surface minority carrier recombination time constant ($t_s$) using said ac photocurrent, capacitance and illumination intensity information and the equation:

$$\frac{|i\_ac|}{C_p \cdot \Phi} = \frac{|q|}{\epsilon_s} \cdot W_{d0} + \frac{t_s \cdot \left( \frac{q}{\epsilon_s} \cdot W_{d0} \right)^2}{2 \cdot \Psi_0} \cdot \Phi$$

where:

q: Electron charge $\epsilon_s$: Dielectric constant of the semiconductor

Wd0: Inversion state surface depletion width (undisturbed, that is, dark conditions)

$\Psi$O: Semiconductor surface potential in inversion and dark conditions.

8. A method of determining the surface recombination velocity of a specimen of semiconductor material comprising:

a. determining $t_s$ of the specimen by:

i. providing a pair of electrodes, ii. positioning the specimen between the pair of electrodes, said specimen being disposed on one of said electrodes and spaced from said other electrode, iii. providing a signal representing the capacitance between the specimen and the electrode spaced from the specimen, iv. illuminating a region of the surface of the specimen arranged for illumination with a beam of light of wavelengths shorter than that of the energy gap of the semiconductor, the beam of light being intensity modulated at a predetermined frequency and varying in intensity over a predetermined range of values, v. applying a fixed bias voltage ($V_g$) between the pair of electrodes, the fixed bias voltage being of a value such that the semiconductor surface is in a state of depletion or inversion, vi. providing a signal representing the ac photocurrent at the region of the specimen illuminated by the light beam, vii. the intensity of the light beam and frequency of modulation of the light beam being such that the ac photocurrent is nearly proportional to the intensity of the light beam and reciprocally proportional to the frequency of modulation of the light beam, viii. providing a signal corresponding to the illumination intensity of the beam of light, and then, ix. determining the surface minority carrier recombination time constant ($t_s$) using said ac photocurrent, capacitance and illumination intensity information, b. determining the doping concentration of the specimen, and then c. determining the surface recombination velocity using $t_s$ and the doping concentration.

9. A method of determining the surface recombination velocity of a specimen of semiconductor material comprising:

a. determining $t_s$ of the specimen by:

i. providing a pair of electrodes, ii. positioning the specimen between the pair of electrodes, said specimen being disposed on one of said electrodes and spaced from said other electrodes,
iii. providing a signal representing the capacitance between the two electrodes,
iv. illuminating a region of the surface of the specimen arranged for illumination with a beam of light of wavelengths shorter than that of the energy gap of the semiconductor, the beam of light varying in intensity over a predetermined range,
v. applying a fixed bias voltage ($V_g$) between the pair of electrodes, the fixed bias voltage being of a value such that the semiconductor surface is in a state of depletion or inversion,
vi. the intensity range of the light beam being such that the capacitance between the two electrodes is measurably changed as the light intensity changes,
vii. providing information corresponding to the doping concentration,
viii. providing a signal corresponding to the illumination intensity of the beam of light,
ix. determining the surface minority carrier recombination time constant ($t_s$) using said signal information so provided, b. determining the doping concentration of the specimen, and then c. determining the surface recombination velocity using $t_s$ and the doping concentration.

* * * * *